United States Patent [19]
Gilliland et al.

[11] Patent Number: 6,071,017
[45] Date of Patent: Jun. 6, 2000

[54] OPTICAL PACKAGE WITH ALIGNMENT MEANS AND METHOD OF ASSEMBLING AN OPTICAL PACKAGE

[75] Inventors: Patrick B. Gilliland, Chicago; Leonid Shatskin, Wheaton, both of Ill.

[73] Assignee: Methode Electronics, Inc., Chicago, Ill.

[21] Appl. No.: 09/095,243

[22] Filed: Jun. 10, 1998

Related U.S. Application Data

[63] Continuation-in-part of application No. 08/862,899, May 23, 1997, Pat. No. 5,815,623, which is a continuation-in-part of application No. 08/588,445, Jan. 18, 1996, Pat. No. 5,812,717.

[51] Int. Cl.[7] .................................................. G02B 6/36
[52] U.S. Cl. .................................. 385/93; 385/92; 385/88
[58] Field of Search ........................................... 385/88–94

[56] References Cited

U.S. PATENT DOCUMENTS

| | | | |
|---|---|---|---|
| 5,452,389 | 9/1995 | Tonai et al. | 385/92 |
| 5,812,717 | 9/1998 | Gilliland | 385/93 |
| 5,815,623 | 9/1998 | Gilliland et al. | 385/93 |

*Primary Examiner*—Phan T. H. Palmer
*Attorney, Agent, or Firm*—David L. Newman

[57] ABSTRACT

An optical package is provide including a housing having first and second ends. A ferrule receiving bore is formed in the first end, and an optics cavity is formed in the second end. The optics cavity and the ferrule receiving bore are axially aligned with one another along an optical axis defined by the package. A mounting cap is inserted over the optics cavity and frictionally engages an outer surface of the housing. The end cap includes an endplate and a substrate having an optical device mounted thereon.

21 Claims, 14 Drawing Sheets

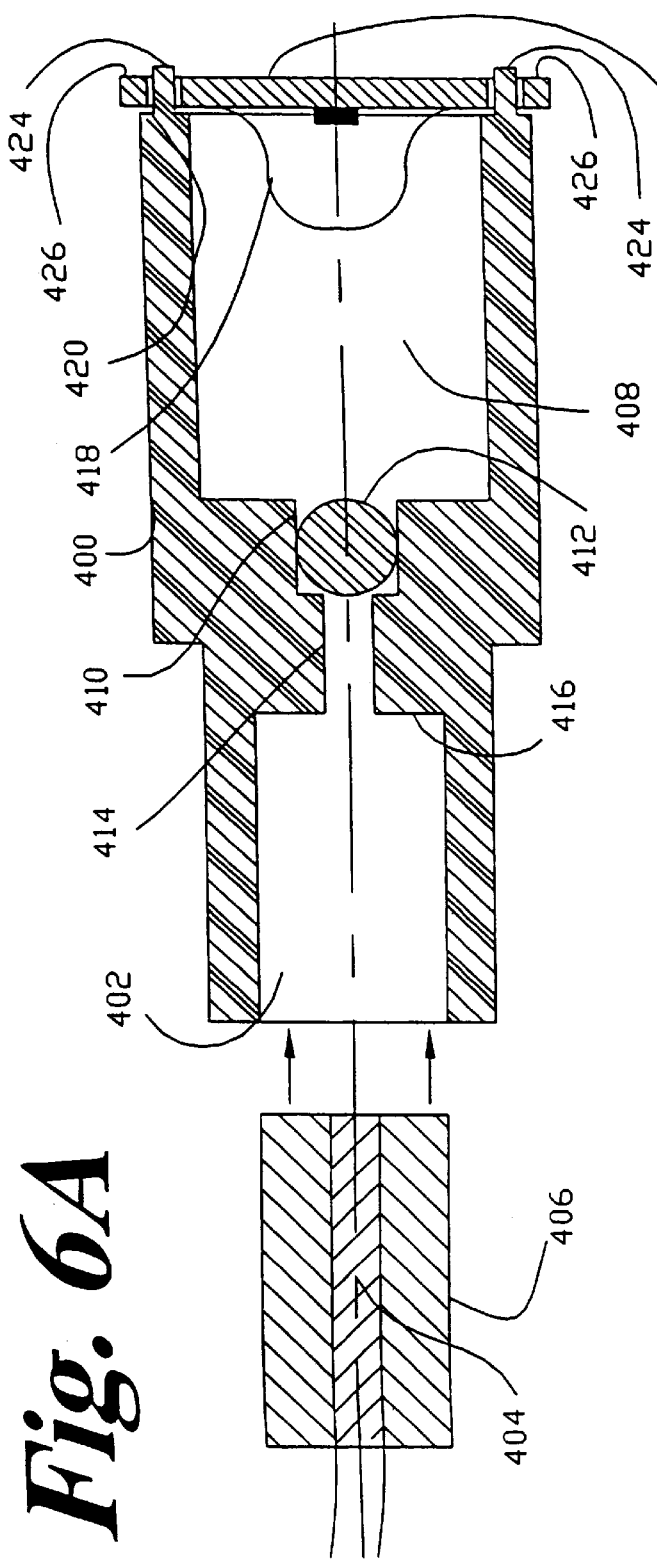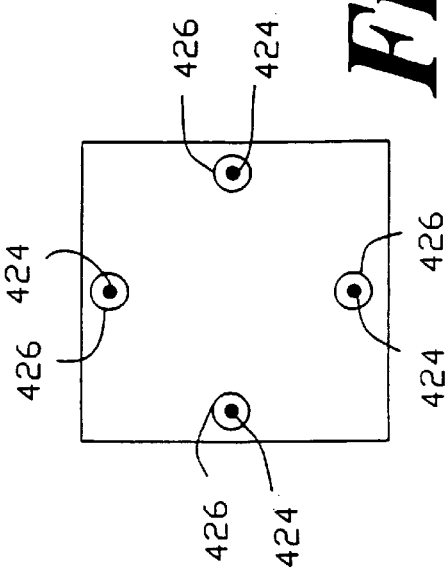

OPTICAL PACKAGE WITH ALIGNMENT MEANS AND METHOD OF ASSEMBLING AN OPTICAL PACKAGE

This Application is a continuation-in-part of U.S. Ser. No. 08/862,899 filed on May 23, 1997, now U.S. Pat. No. 5,815,623 which is a continuation-in-part of U.S. Ser. No. 08/588,455, filed on Jan. 18, 1996, now U.S. Pat. No. 5,812,717.

BACKGROUND OF THE INVENTION

This invention pertains generally to optical transceivers and, in particular, to an optical device package for an optical transceiver.

Optical transceivers are known in the art and include active optical devices or diode packages. Common diode packages include LED packages such as a TO-46 package or a laser diode package such as RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. The TO can is hermetically sealed. The hermetic sealing of the TO can is a time-consuming and expensive process which adds to the overall expense of the LED or laser package. As well, the commonly known TO cans do not have the emission area of the diode aligned within the TO can in a consistently centered orientation. Thus, placement of the TO can in a uniform position does not provide for alignment of the diode to an optical connector and maximum power transmission is not achieved. Thus, alignment of the TO package becomes a time-consuming and expensive process.

Commonly known housings for optical transceivers require complex mechanical means in order to align the diode package, the lens, the bore and the optical waveguide ferrule. Mechanical means, such as a screw is commonly used to actively align the TO can within the housing.

Further, a molded plastic housing is often used having precision molded cavities specifically sized for receiving a diode package, another cavity specifically sized for receiving a lens and another cavity specifically sized for receiving an optical waveguide ferrule. Such an optical transceiver housing is often rendered ineffective in production due to variations in the alignment of the LED or laser relative to the TO can.

In view of the above, it is an object of the present invention to provide an optical device package which is quickly and inexpensively manufactured.

It is a further object of the present invention to provide an optical device package which may be easily aligned with an optical transceiver housing.

It is another object of the present invention to provide an optical package having a single optical axis.

SUMMARY OF THE INVENTION

A principal object of this invention is to provide an optical package comprising a housing including a bore for receiving an optical waveguide and a focusing element adjacent the bore, the bore and the focusing element being aligned along a common optical axis, a diode mounted to a substrate adjacent the focusing element and an alignment means associated with the housing for aligning the substrate along the optical axis. The alignment means may include a trace located in a predetermined position on the substrate to which the housing is mounted. The alignment means may include a groove located in a predetermined position on the substrate to which the housing is mounted. The housing may include an outer sleeve defining the bore for receiving an optical waveguide and an inner sleeve for receiving the focusing element. The inner sleeve may include a lens support means for mounting the focusing element. The focusing element may be mounted in a lens support means. The lens support means may include a plastic washer having a bore of a diameter less than the diameter of the focusing element. The focusing element may be a ball lens. The groove may be formed between conductive traces adhered to the substrate. The groove may be integrally molded with the substrate. The bore may have a diameter of approximately 0.0984 inches or greater. The height of the inner sleeve may be less than the height of the outer sleeve. The inner sleeve may be partially filled with an optical filler composition. The alignment means may include a precision formed aperture in the housing for receiving the substrate. The substrate may be a precision formed material having a predetermined size and the diode mounted thereto in a predetermined orientation on the substrate. The focusing element may be integrally molded with the housing. The housing and the focusing element may be formed of a transmissive material allowing for the transmission of wavelengths from 780–1350 nanometers.

In an embodiment, an optical package is provided comprising a substrate having a diode mounted thereto and a groove formed in the substrate surrounding the diode, an inner sleeve mounted within the groove having a lens therein and an outer sleeve mounted to the substrate surrounding the inner sleeve for receiving an optical ferrule. The groove may be formed between conductive traces adhered to the substrate. The groove may be integrally molded with the substrate. The inner sleeve may include a tab protruding within the sleeve to provide support to the lens. The inner sleeve may be formed of stainless steel, brass, nickel silver or ARCAP®. The outer sleeve may have a cylindrical shape and include a bore having an inner diameter of 0.0984 inches or greater. The height of the inner sleeve may be less than the height of the outer sleeve. The diode may be a surface emitting diode. The diode may be an LED. The diode may be a vertical cavity surface emitting laser (VCSEL). The diode may be a photodiode. The inner sleeve may be partially filled with an optical filler composition. The optical filler composition may be an epoxy or a silicone composition. The optical filler composition may form a meniscus at the base of the lens to provide retention of the lens. The tabs of the inner sleeve may be formed from portions of the inner sleeve wall which are punched from the wall and protrude within the interior of the inner sleeve. The optical package may include a single optical axis wherein the diode has an emission point providing an emission axis upon which the lens and the ferrule are aligned.

In an embodiment, an optical package is provided comprising a substrate having an outer trace forming a circle and a pair of circular concentric inner traces formed within the outer trace and the pair of concentric inner traces defining a groove therebetween, an inner cylindrical sleeve mounted within the groove including a tab punched from the sidewall of the inner sleeve protruding toward the center of the cylindrical inner sleeve, a surface emitting diode and lens mounted within the inner sleeve and an outer cylindrical sleeve mounted on the outer trace defining an inner bore having a diameter of 0.0984 inches or greater and having a height greater than the inner sleeve. The inner traces may be formed from conductive copper traces. The diode may be mounted to the substrate. The lens may be a ball lens supported by the tab of the inner sleeve.

In an embodiment, an optical package is provided comprising a housing including a bore for receiving an optical waveguide, a focusing element adjacent the bore and a precision formed aperture for receiving a substrate, the bore, the focusing element and the aperture being aligned along a common optical axis and a diode mounted to the substrate. The substrate may be a precision formed material having a predetermined size and the diode mounted thereto in a predetermined orientation on the substrate. The substrate may be formed of a silicon material. The focusing element may be integrally molded with the housing.

A method of assembling an optical package is provided including the steps of forming a housing having a bore and a focusing element adjacent the bore, the focusing element and the bore aligned along a common optical axis, mounting a diode to a substrate in a predetermined position and mounting the substrate to the housing so that the diode is centered on the optical axis. The method further including the steps of forming an alignment means on the substrate or the housing and mounting the substrate to the housing via the alignment means. The method further including the steps of forming the alignment means of a precision aperture in the housing and receiving a precision formed substrate in the aperture.

The method further including the steps of forming a groove on a substrate surrounding a central point, mounting the diode at the central point of the substrate, mounting an inner sleeve within the groove, securing the inner sleeve to the substrate, mounting the focusing element within the inner sleeve, placing an outer sleeve on the substrate surrounding the inner sleeve, aligning the outer sleeve along the optical axis and securing the outer sleeve to the substrate. The method of assembling the optical package may include the step of injecting an optical filler composition into the inner sleeve after the lens is inserted therein. The method of assembling the optical package wherein the outer sleeve is mounted on an outer conductive trace adhered to the substrate and the outer sleeve is secured thereto via solder. The method of assembling an optical package wherein the outer sleeve may be integrally molded with the lens and inner sleeve. The method of assembling an optical package wherein the outer sleeve is actively aligned by inserting a ferrule of an optical waveguide attached to a power meter and to the bore of the outer sleeve, adjusting the outer sleeve laterally until a desired power level is achieved and securing the outer sleeve to the substrate.

As noted, an optical package can be made of molded plastic having precision molded cavities formed therein. Additional embodiments take advantage of the many special properties of a plastic housing, providing additional alternate mechanisms for aligning a bore, a focusing element, and a substrate having an optical diode mounted thereon. In an embodiment, the housing is formed with a first bore for receiving an optical waveguide in the form of a fiber optic connector ferrule surrounding an optical fiber. A second bore, or more generally a base cavity, is formed in the base of the housing opposite the first bore. The base cavity is configured to receive a focusing element and an optical element, such as a VCSEL, LED, or photodiode. A smaller internal cavity is formed at the end of the base cavity, and acts as a support means for the focusing element. A small through hole communicates between the focusing element support cavity and the first bore, allowing optical radiation to pass from the focusing element to an optical waveguide inserted into the first bore. Mounting posts extend from the base of the housing, circumferentially spaced around the base cavity. The optical element is mounted to a separate substrate having alignment holes formed therein. The alignment holes are positioned to receive the mounting posts extending from the base of the housing, and are formed having a larger diameter than the posts such that the substrate can be maneuvered relative to the housing to facilitate alignment of the various optical components. Alignment is performed actively, and when the maximum amount of optical radiation is coupled to the optical waveguide, the posts are bonded to the substrate to hold the housing in place and maintain proper alignment.

Optional bonding methods include reflowing the plastic posts using a $CO_2$ laser, infrared heat source, hot air, or some other means of heating and melting the plastic posts. Using this technique the mounting posts are melted and the molten plastic reflows into the alignment holes, filling the spaces between the posts and the substrate. After completely filling the alignment holes, the excess plastic from the melted posts forms a meniscus or mushroom shaped dome of material over each alignment hole. Upon cooling, the plastic hardens to form a secure bond between the housing and the substrate. A similar method for adhering the housing to the substrate involves heating the plastic posts, but rather than fully melting and reflowing the posts, either a rivet forming tool or a compressive blast of hot air is used to compress the posts into the proper mushroom shaped dome necessary to secure the substrate to the housing. A third method for bonding the housing to the substrate involves hot melting an epoxy into the alignment holes and allowing the epoxy to bond the two pieces together. Finally, a fourth method involves forming the substrate itself out of a plastic material similar to that used for the housing, and laser welding the two pieces together. While the methods disclosed herein are preferred, it should be clear to those skilled in the art that other bonding methods may be employed without deviating from the novel aspects of the present invention.

In another embodiment incorporating a plastic housing, the plastic housing is identical to that described previously, except the mounting posts are omitted. In their place, a circular metal insert is inserted into the base cavity of the housing. The metal insert is formed with an annular flange which engages the base of the housing to provide a positive stop against excessive insertion of the insert into the housing. Surface features such as a knurled finish, barbed teeth, or threads, or some other friction enhancing feature, are formed on the outer surface of the insert so that upon insertion into the housing, the insert frictionally engages the side walls of the housing. The optical device is mounted on a substrate which is either partially or entirely formed of metal. Minimally, the edges of the substrate are metallized to facilitate bonding the substrate to the metal insert. The substrate is placed over the annular flange and the optical components actively aligned. Upon proper alignment of the optical components, the metallized edges of the substrate are bonded to the annular flange of the metal insert by laser welding, soldering, or other known techniques for bonding metal components. In an alternate arrangement, the metal insert engages the outer surface of the housing forming somewhat of a metal cap over the optics cavity, but having a circular aperture formed in the end thereof for receiving the optical element. Again, surface features formed on the mating surface of the insert frictionally engage the outer surface of the housing to form a tight interference fit therewith.

In an embodiment, the lens cavity is formed immediately adjacent the optics cavity, and retaining features are molded into the lens cavity around the opening joining the lens cavity to the optics cavity. The retaining features act to hold the focusing element within the lens cavity. The retaining features are slightly compressible so that the focusing element can be press fit into the cavity past the retaining features. When the focusing element is fully inserted past the retaining features, the retaining features expand to their natural extent, thereby capturing the focusing element within the lens cavity.

In yet another embodiment, the retaining features include a pitched annular wall surrounding the lens cavity. Externally the pitched wall is supported by a plurality of plastic support buttresses which add rigidity to the wall. The wall defines a lens cavity where the entrance to the cavity is narrower than the base of the cavity, and the diameter of the focusing element itself.

In another, similar embodiment, the lens cavity is formed immediately adjacent the ferrule receiving bore. The focusing element is insertable into the lens cavity through the ferrule receiving bore. Compressible retaining features are molded into the lens cavity around the opening joining the lens cavity to the ferrule receiving bore.

In a further embodiment, a plastic housing provides an improved mechanism for aligning the mating optical waveguide with the plastic optical package. A split bore feature is incorporated with a first optical waveguide receiving bore. The split bore embodiment contemplates at least one narrow slot formed in the optical waveguide receiving bore, extending from the receiving end of the bore toward the base of the bore near the point where a focusing element is mounted. The slot or slots allow the walls of the housing to flex as the waveguide is inserted into the bore. Precision alignment of the waveguide is only necessary at the base end of the bore adjacent the focusing element. The flexibility of the bore sidewalls diminishes toward the end of the slots. Thus, as an optical waveguide is inserted into the bore, the increasing rigidity of the sidewalls gradually forces the waveguide to the precision alignment position at the base of the bore. This arrangement has the advantages of simplifying the mating procedure of the waveguide to the housing, and reducing the area of precision molding necessary to properly align the waveguide, thereby reducing the cost of molding the plastic housing.

These and other features of the invention are set forth below in the follow detailed description of the presently preferred embodiments.

BRIEF DESCRIPTION OF THE DRAWINGS

FIG. 6A is a side elevation cut-away view of an additional alternative embodiment of the present invention;

FIG. 6B is an end view of the embodiment shown in FIG. 6A showing a substrate member covering the base of the optical housing, with housing mounting posts extending through alignment holes formed in the substrate;

FIG. 6C is a section view of the plastic housing and substrate of FIG. 6A after the mounting posts have been reflowed to bond the substrate to the housing;

DETAILED DESCRIPTION OF THE PRESENTLY PREFERRED EMBODIMENTS

Figure 1:
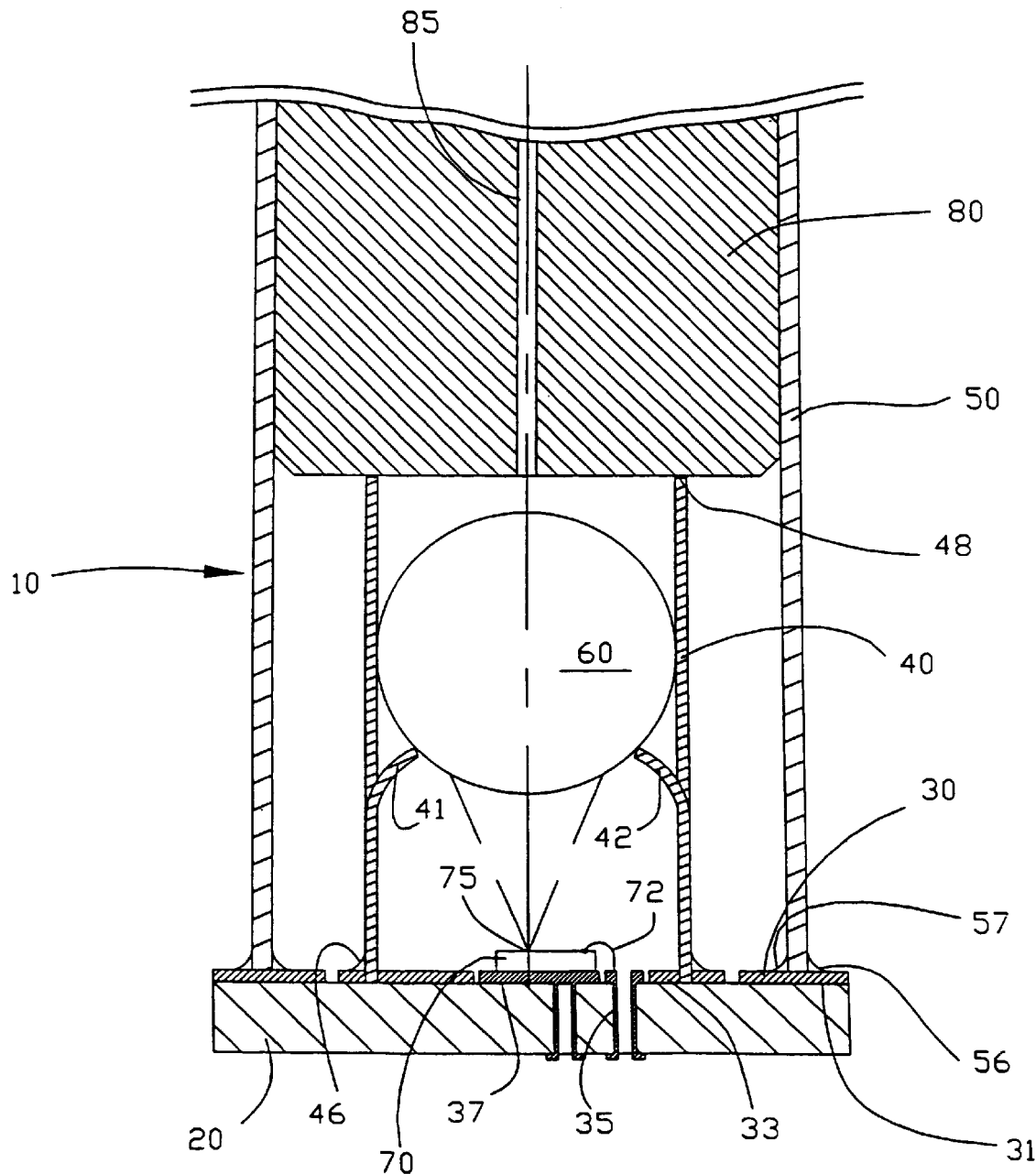
FIG. 1 is a side elevation cut-away view of the present invention.

The present invention, as shown in FIG. 1, relates to an optical package housing 10 comprising a substrate 20 having an alignment means such as traces 30 adhered thereto. Mounted to the substrate 20 is inner sleeve 40 and outer sleeve 50. Mounted within the inner sleeve 40 is ball lens 60 and optical device or diode 70. Received within the outer sleeve 50 is optical waveguide ferrule 80 including optical fiber 85. The present invention may be better understood by a description of a preferred embodiment of assembling the optical package housing 10. The substrate 20, for example, FR4, has traces 30, such as conductive four ounce copper traces adhered thereto. For example, a subtractive etching process or an additive process such as vacuum deposition may be used to pattern the substrate 20. The conductive traces 30 are adhered in a predetermined orientation providing for an outer trace 31, a sleeve groove 33 and also forming through-holes 35. The through-holes 35 provide retention points for the conductive traces 30 to avoid delamination of the conductive traces 30 from the substrate 20 when subjected to mechanical stress. In an alternate embodiment, through-holes 35 may provide an access point for injecting an optical filler composition such as an epoxy within the cavity of the inner sleeve 40 to provide for index matching or chip passivation. In an alternative embodiment, the substrate 20 may be a polymer material and the conductive traces 30 may be a conductive ink adhered thereto or the groove 33 may be integrally molded of the polymer material. The outer trace 31 and sleeve groove 33 provide for a means of aligning the optical package 10. The outer trace 31 and sleeve groove 33 are circular in order to receive the cylindrical outer sleeve 50 and cylindrical inner sleeve 40, respectively. The diode 70 is mounted to the conductive trace 37. In a preferred embodiment, a surface emitting LED is used. However, a laser or photodiode may be incorporated as well. The LED 70 receives its power from a pin inserted in through-hole 35 or a circuit trace on the backside of substrate 20 which is attached via a wire bond 72 to the diode 70. Also mounted to the substrate are the electronics to operate the optical device, for example, a driver circuit for a transmitter or an amplification and decision circuit for a receiver and connected to the LED or pin diode via conductive trace 37. Also, mounted to the substrate may be a power feedback means.

The inner sleeve 40 is assembled by forming lens support means, or tabs 41, 42 from the sidewalls of the inner sleeve 40. In a preferred embodiment, the inner sleeve 40 is formed of a metallic material such as stainless steel, brass, nickel silver, or ARCAP®. The inner sleeve 40 is then mounted within sleeve groove 33 on the substrate 20. The groove 33 acts as an alignment means for the inner sleeve 40. The inner sleeve 40 is attached within the groove 33 by solder 46. A focusing element, such as a ball lens 60 is then placed within the sleeve 40 so that it rests on the distal ends of the tabs 41, 42. The area of the inner sleeve 40 below the ball lens 60 is filled with an optical filler composition such as epoxy. The epoxy provides retention and support for the ball lens 60 beyond the tabs 41, 42 and also protects the LED 70. The filler composition may also provide for an optical attenuator having a predetermined refractive index such as by using filled silicone or epoxy. Therefore, it may be understood that the ball lens 60 is maintained in its lateral and axially orientation within the inner sleeve 40 by the tabs 41, 42 of the sleeve 40. In addition, the sleeve 40 may have an inner diameter equal to the outer diameter of the ball lens 60 so that a snug fit is achieved when the ball is inserted within the sleeve 40 so that it is supported at its bottom by the tabs 41, 42 and at its equator by the sides of the sleeve 40. While a ball lens is a preferred light condensing element, other lenses may also be inserted within the sleeve 40.

The outer sleeve 50 is then mounted to the substrate 20. Generally, the outer sleeve 50 has a bore 51 having an inner diameter slightly greater than the diameter of a standard ferrule of 0.0984 inches. A ferrule 80 is then inserted within the bore of the outer sleeve 50. The optical waveguide, or ferrule 80 is inserted until it abuts the distal end 48 of the inner sleeve 40. The distal end 48 of the inner sleeve 40 prohibits the insertion of the ferrule any further. While the inner sleeve 40 is generally rigid, the ferrule 80 is generally mounted within a fiber optic connector having a spring to provide for axial compression of the ferrule 80 so that upon abutment with the distal end 48 of the inner sleeve 40, there is some compression provided to avoid damaging the end face of the ferrule 80. The distal end 48 of the inner sleeve 40 is formed as straight as possible so that abutment with the ferrule 80 acts to enclose the inner chamber of the inner sleeve 40 so that there are little or no gaps between the ferrule 80 and the distal end 48 of the inner sleeve 40. In any event, the ball lens 60 will focus the majority of the light emitted from the diode 70 toward the optical fiber 85 within the ferrule 80.

The optical package 10 is then actively aligned. The ferrule 80 is attached to a power meter and the outer sleeve 50 is moved laterally along the substrate 20 in order to find the optimum alignment position. Upon finding the optimal alignment position where the photons emitted from the emission point 75 of the LED or laser provide the highest power upon transmission through the optical fiber 85 of the ferrule 80, the outer sleeve 50 is secured in place. The outer sleeve 50 is secured to the outer trace 31 by solder 56, 57 adhered along the bottom edge of the outer sleeve 50. Any standard means of applying solder may be used such as a solder gun or via solder pads adhered to the outer trace 31 or the substrate 20 and being exposed to heat such as infrared or hot air. The outer trace 31 acts as an alignment means for the outer sleeve 50. Therefore, it may be understood that an optical package 10 is provided which eliminates the need for a preassembled TO can and provides for an easily and inexpensively assembled and aligned package. In a preferred embodiment, the package has a single optical axis. As shown in FIG. 1, the emission axis from the emission point 75 of the optical element 70 is the same axis upon which the lens 60 and optical fiber 85 are aligned. This arrangement allows for the simple construction of the coaxial sleeves 40, 50 of the present invention.

Figure 2:
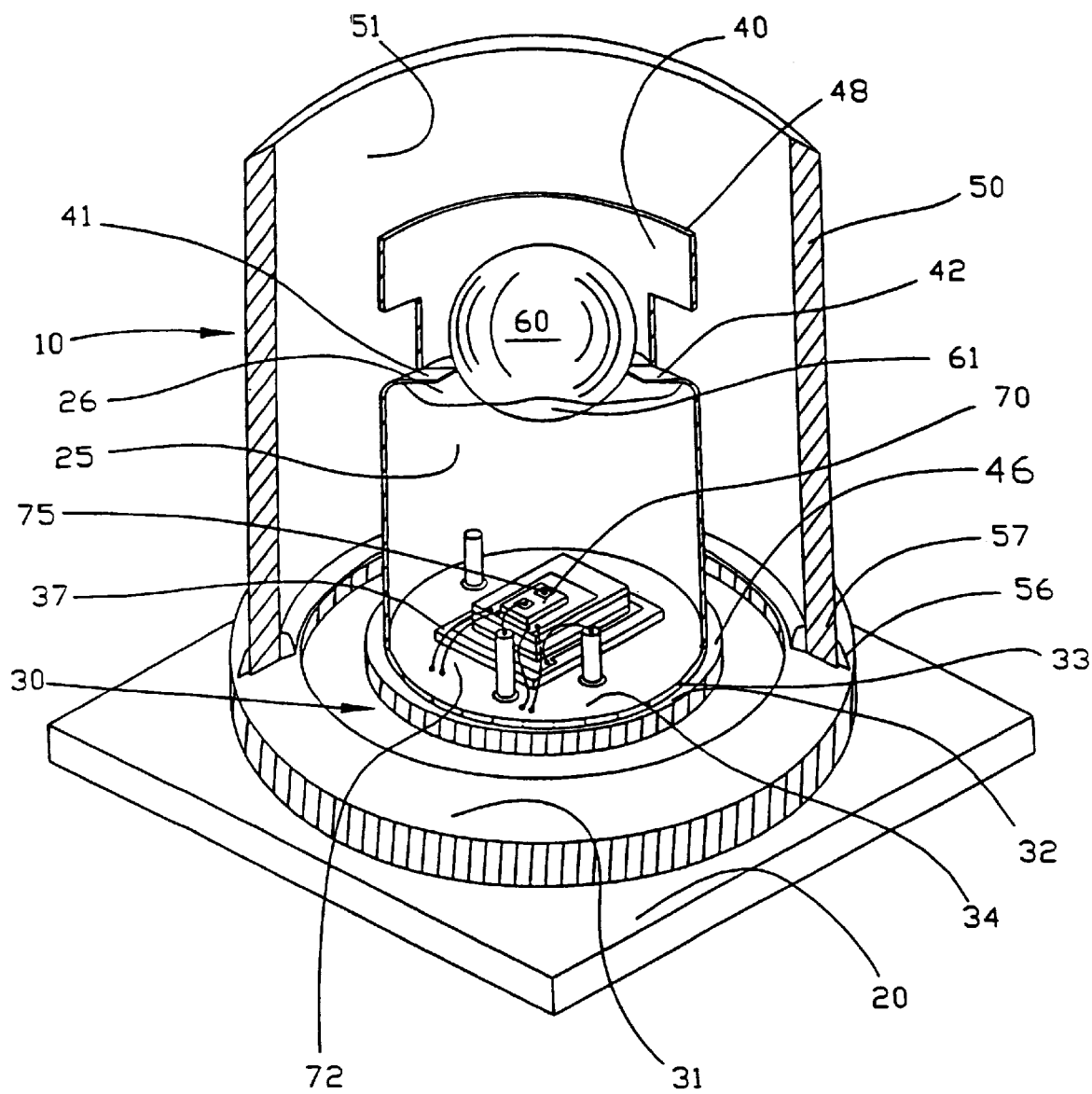
FIG. 2 is a perspective view of the present invention partially cut away.

Turning to FIG. 2, a perspective view of the invention is shown. The substrate 20 and traces 30 are shown in a complete view while the outer sleeve 50 and the inner sleeve 40 are shown partially cut away so that the present invention may be more easily viewed. Adhered to the substrate 20 is outer trace 31, and inner traces 32 and 34 which define sleeve groove 33. Also adhered to the substrate 20 is conductive pad 37. The conductive pad 37 has mounted thereto diode 70. In the embodiment shown in FIG. 2, the diode 70 is a vertical cavity surface emitting laser (VCSEL). The diode 70 receives power from wirebonds 72.

The inner sleeve 40 is mounted within sleeve groove 33 and secured within the groove 33 and to the traces 32, 34 by a chemical bonding agent 46 such as epoxy or solder. Tabs 41, 42 are punched out of the sides of the inner sleeve 40 so that they protrude generally perpendicular to the inner sleeve walls 40 toward the interior of the inner sleeve 40. The inner sleeve 40, in a preferred embodiment, forms a hollow cylinder except for the tabs 41, 42 protruding toward the center of the cylinder. In a preferred embodiment, four tabs protrude into the cylinder in order to support the ball lens 60 therein. The ball lens 60 is mounted within the inner sleeve 40 and is supported by tabs 41, 42. An optical filler composition 25 is injected into the bottom of the inner sleeve 40 in order to seal the diode 70 and support the ball lens 60 and secure it in a centered position along the optical axis above the emission point 75 of the diode 70. An optical filler composition such as an epoxy or optical silicone may be used. The filler composition 25 forms a meniscus 26 below the tabs 41, 42 and above the base 61 of the ball lens 60. In accordance with the present invention, it can be understood that the mounting of the inner sleeve 40 as discussed above, is quickly and easily assembled and overcomes the need for an expensive component such as a TO-46 diode can. The mounting of the diode 70 to the substrate 20 and the inner sleeve 40 require alignment within approximately 0.003 inches of the optical axis of the optical package housing 10.

The precision alignment is performed by active alignment of the outer sleeve 50. The outer sleeve 50 is a cylindrical shell mounted on the circular outer trace 31. In a preferred embodiment, the outer sleeve 50 may be a solderable metallic material such as nickel silver, brass or ARCAP®. In an alternate embodiment, the outer sleeve 50 may be made of a polymer material such as Valox and may be molded integrally with the lens and inner sleeve which may also be a polymer material. The outer sleeve 50 includes a precision aligned bore 51 which may be polished. The bore 51 includes a diameter of approximately 0.0984 inches or greater to provide a low insertion force fit around a ferrule of an optical waveguide. Other ferrule diameters may also be accommodated by the bore 51 to allow for insertion of ferrules having a diameter of less than or greater than 0.0984 inches. Prior to securement of the outer sleeve 50 to the substrate 20, a ferrule is inserted within the bore 51 until it reaches the top edge 48 of the sleeve 40. The edge 48 acts as a stop-abutment to the ferrule.

The ferrule inserted within the bore 51 will be attached to an optical waveguide which is attached to a power meter in order to measure the power level being transmitted through the optical waveguide. The ferrule sleeve 50 is moved laterally on the substrate 20 which simultaneously moves the ferrule inserted within the bore 51 of the outer sleeve 50. The optical fiber position is adjusted along a transverse axis to a light beam or emission axis of the diode 70. Upon locating the outer sleeve 50 in a position achieving a satisfactory power level, the outer sleeve 50 is then secured to the substrate using solder or a chemical bonding composition. For example, an epoxy or solder 56, 57 may be used. According to the above description, it may be understood that an optical transceiver apparatus may be easily, quickly and inexpensively manufactured. Such an apparatus may provide for transmission of light waves with a coupling efficiency in excess of 25% at an operating temperature between −400 and +850 Celsius.

Figure 3:
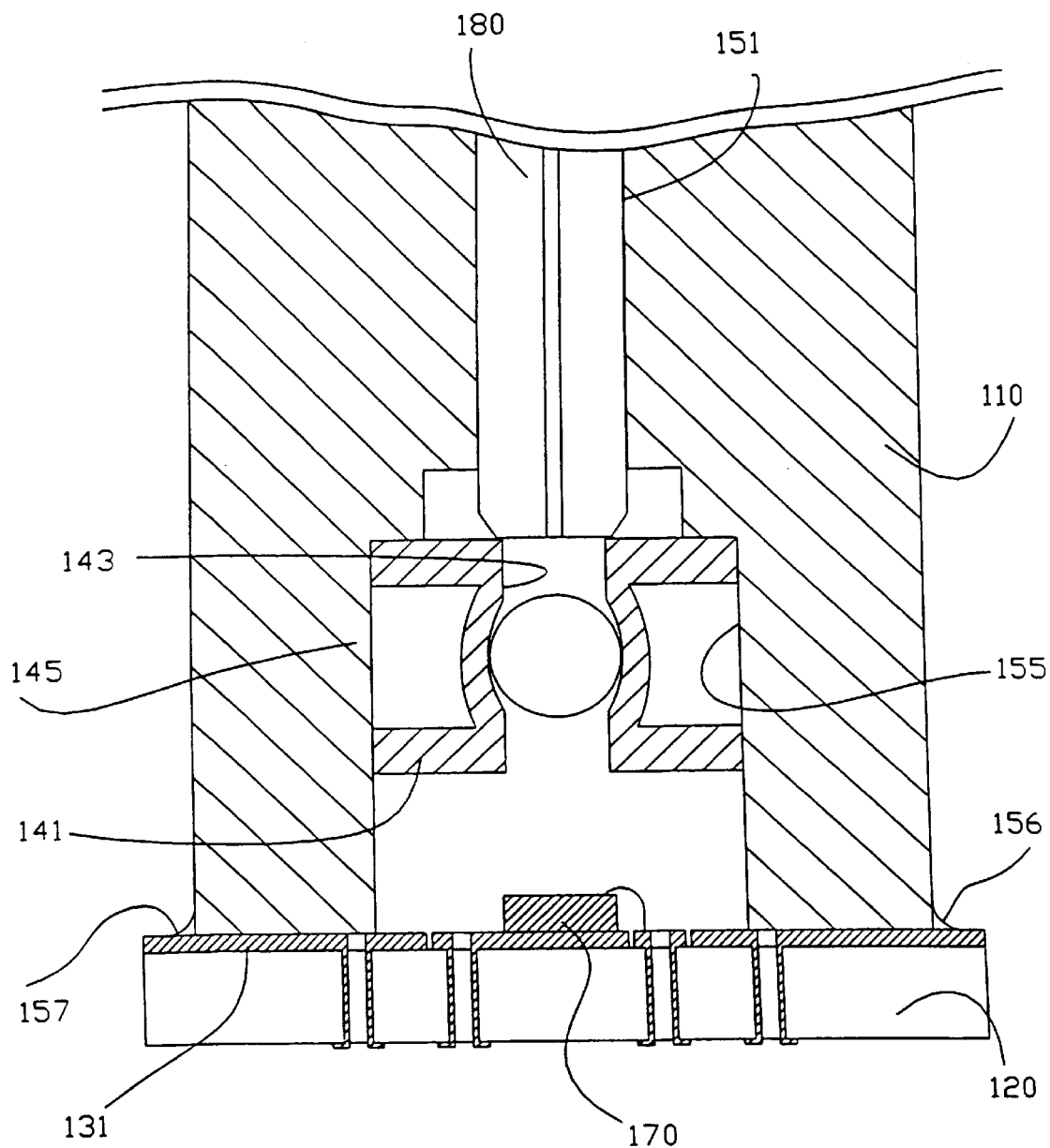
FIG. 3 is a side elevation cut-away view of an alternate embodiment of the present invention.

Turning to FIG. 3, an alternate embodiment of the present invention is shown having optical package housing 110 having a bore 151 for receiving ferrule 180. Adjacent the bore 151 is lower aperture 155. Mounted within the lower aperture 155 is lens support means 141. In this alternate embodiment, the lens support means 141 may be a washer made of a polymer material having an inner bore 143 having a length greater than the diameter of ball lens 160. In a preferred method of assembling the alternate embodiment shown in FIG. 3, the washer 141 is inserted within the aperture 155 so that it is adjacent the bore 151. A focusing element such as a ball lens 160 is inserted within the inner bore 143 of the washer 141. The inner bore 143 has a diameter slightly less than the diameter ball lens 161 so that the sidewalls 145 of the washer 141 expand upon insertion of the ball lens 160 therein. Therefore, it is preferred that a flexible polymer material such as SANTOPRENE™ (Advanced Elastomer Systems, L.P.) be used. The ball lens 160 may be inserted in the inner bore 143 of the washer 141 using an insertion tool. The washer 141 may be secured within the aperture 155 via chemical bonding means such as by epoxy. In addition, the force of the ball lens deforming the sidewalls 145 also causes the washer 141 to deform and frictionally abut the walls of the aperture 155 and aids in securing the washer 141 in position. The aperture 155 and the bore 151 are precision machined from a solderable material such as brass, nickel silver, or ARCAP® so that an optical waveguide 180 inserted within the bore 151 will be aligned along an optical axis which bisects the focusing element 160 mounted within the lens support means 141.

The optical package housing 110 is then mounted to a substrate 120 similar to that discussed above for the outer sleeve 50 as shown in FIGS. 1 and 2. The housing 110 is placed onto the substrate 120 so that the aperture 155 encloses the diode 170. The diode may include, but is not limited to, an LED, a VCSEL, a laser diode or a photodiode. The optical package is actively aligned by powering up the diode 170 and attaching the optical waveguide 180 to a power meter and moving the housing 110 laterally along the substrate 120 until an optimum reading is achieved. The housing 110 is preferably formed of a solderable material such as ARCAP® and the housing is soldered at solder points 156, 157 to the alignment means or traces 131 of the substrate 120. The embodiment of FIG. 3 is an improvement over the embodiment of FIGS. 1 and 2 in that the housing 110 is a single unit which has the bore 151 and the lower aperture 155 formed of a single member. Therefore, it is not necessary to align both an outer and inner sleeve on a substrate.

A further alternate embodiment of the present invention may be understood with reference to FIG. 3 which provides for passive alignment. The substrate 120 may include along its upper surface a groove such as that shown in FIGS. 1 and 2, however, being precision formed to receive a protruding member from the housing 110. The substrate 120 may be precision formed such as by molding of a polymer substrate and the diode 170 may be precision aligned to the substrate. Upon mounting of the housing 110 to the substrate 120, the diode 170 will be passively precision aligned along a common single optical axis with the focusing element 160 and the bore 151. The focusing element 160 and the lens support means 141 may be both integrally molded with the housing 110, such as disclosed for FIGS. 4 and 5.

Figure 4:
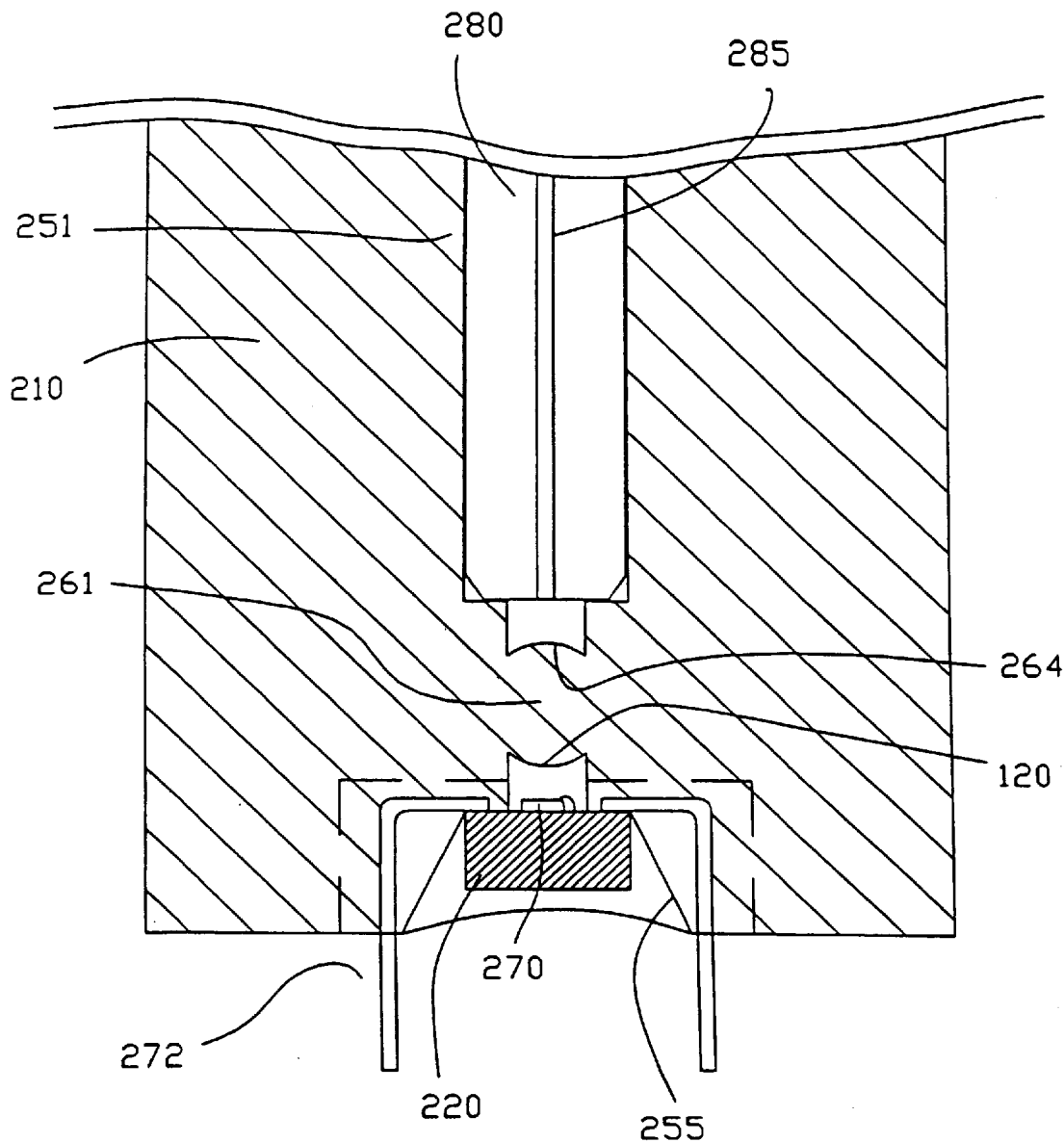
FIG. 4 is a side elevation cut-away view of another alternate embodiment of the present invention.

Turning to FIG. 4, another alternate embodiment of the present invention is shown having a housing 210 having a bore 251 for receiving an optical waveguide 280. Adjacent the bore 251 is a focusing element 260 and adjacent the focusing element 260 is an alignment means or precision formed lower aperture 255. In this alternate embodiment, the housing 210 is preferably formed of a transmissive material such as Ultem0 and the focusing element 261 is integrally molded with the rest of the housing 210. The housing 210 is made of a material which allows for the transmission of lightwaves in the range of 780–1350 nanometers. The focusing element 261 includes a light refracting surface 263 and 264. Mounted within the aperture 255 is a substrate 220 which has mounted thereto a diode 270. The diode may include, but is not limited to, an LED, a VCSEL, a laser diode or photodiode. The substrate 220 is precision formed so that its dimensions are precisely formed to a predetermined size. The substrate 220 is preferably a silicon material which is anisotropically etched and cleaved to a predetermined size. The walls of the aperture 255 are also precision formed so that upon insertion of the substrate 220 within the aperture 255, the diode 270 which is also precision aligned on the substrate 220 will be aligned along an optical axis upon which the focusing element 261 and the bore 251 are centered. The aperture 255 of the housing 210 may be precision formed by any known methods, for example, using precision molding techniques including, injection molding, casting or precision grinding methods. The diode 270 is mounted on the silicon substrate using known methods of alignment, such as by infrared alignment means. This embodiment allows for passive alignment of the optical package. The substrate 220 is inserted within the aperture 255 so that it mounts in a predetermined, centered position. The emission point of the diode is centered on the optical axis so that the light waves of the diode strike refracting surface 263 of the focusing element 261. The light waves are then focused and transmitted from the refracting surface 264 of the focusing element 261 into the optical fiber 285 of the optical waveguide 280.

The substrate 220 may also have electronics to operate the optical device, including a driver circuit, an amplification and decision circuit and a power feedback means. The substrate 220 may be electrically connected via contacts 272 which may be mounted within the housing material 210 and have exposed portions adjacent the substrate 220 and the substrate may be soldered thereto. The substrate 220 may be secured within the aperture 255 via means such as chemical bonding, for example use of an epoxy composition. The embodiment shown in FIG. 4 discloses the diode 270 mounted on the substrate 220 adjacent the focusing element 261. Use of an epoxy or silicone compound "passivates" the LED or laser by creating a barrier to moisture and/or other corrosive agents.

Figure 5:
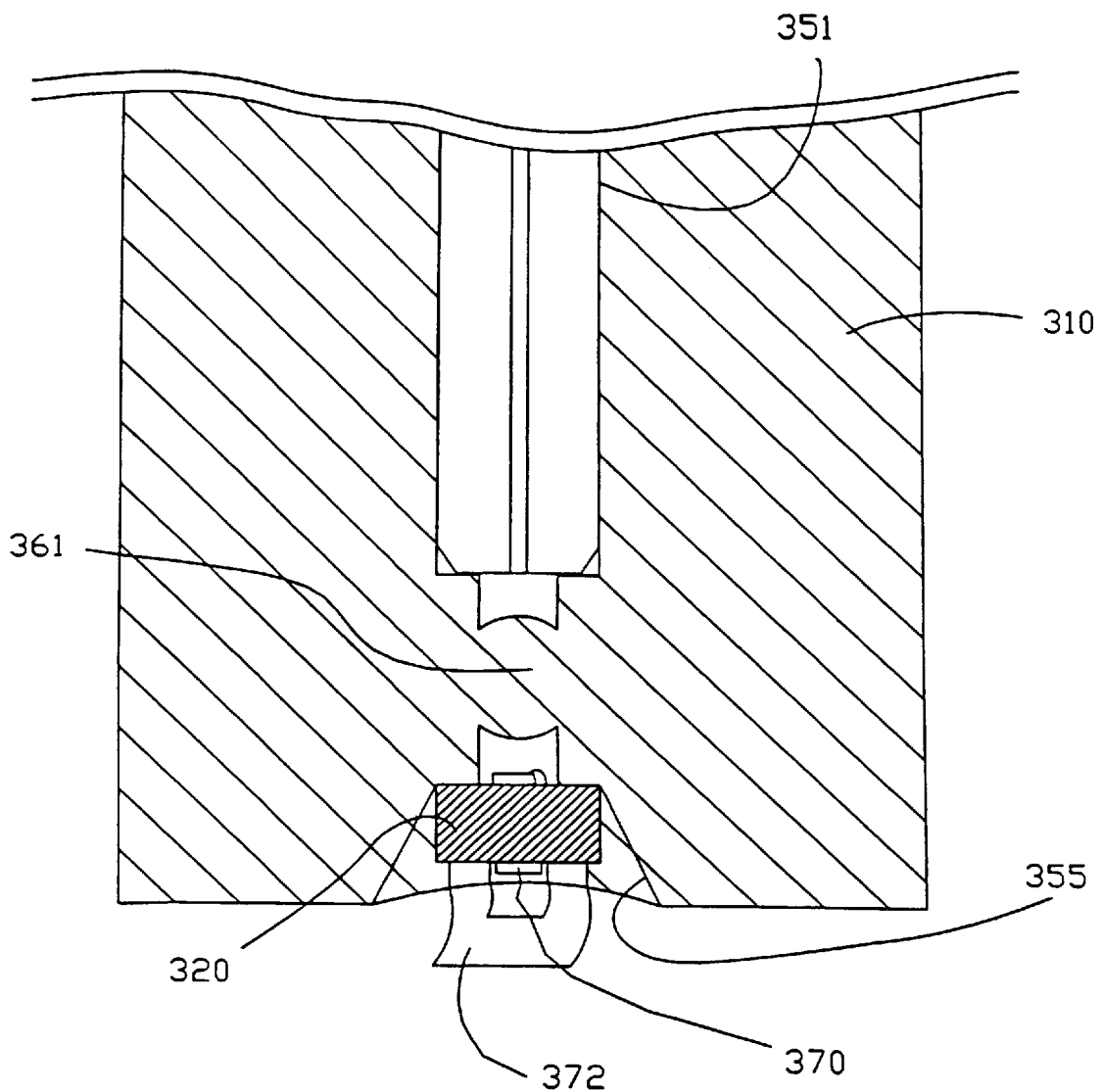
FIG. 5 is a side elevation cut-away view of a further alternative embodiment of the present invention.

Turning to FIG. 5, a further alternate embodiment is shown having the diode 370 mounted as a "flip chip" or on the surface of the substrate 320 opposite the surface which is adjacent the focusing element 360 so that the emission point is abutting the substrate and transmits therethrough. The diode may include, but is not limited to, an LED, a VCSEL, a laser diode or a photodiode. In such an orientation, the substrate 320 may have its electronics connected via flexible circuit member 372 to external components. In such an embodiment, the substrate 320 is preferably formed of a material which is optically transmissive and allows for the transmission of lightwaves of up to 780–1350 nanometers such as silicon or transparent glass. The embodiment of FIG. 5 also allows for passive alignment similar to the embodiment of FIG. 4 in that the substrate is positioned within aperture 355 so that the prepositioned diode 370 is aligned on the optical axis along with the focusing element 361 and the bore 351.

Figure 7:
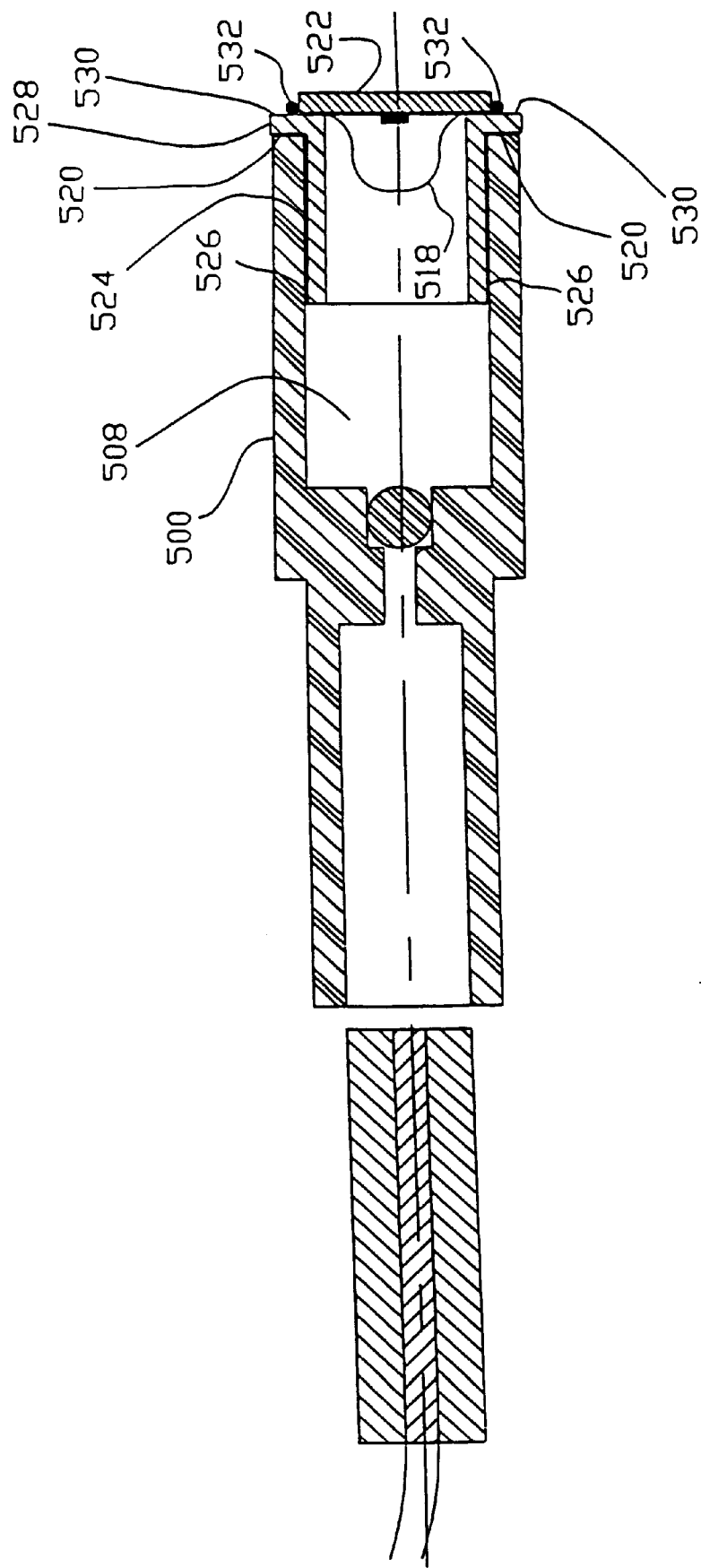
FIG. 7 is a side elevation cut-away view of yet another alternative embodiment of the present invention.

Additional embodiments are shown in FIGS. 6 and 7 incorporating a single piece plastic housing. Turning to FIG. 6, a generally cylindrical shaped housing 400 is shown in cross section taken along the axial centerline of the cylinder. The housing includes a first bore 402 for receiving an optical waveguide 404 enclosed in an alignment ferrule 406. As with the previous embodiments, first bore 402 has a diameter only slightly larger than a standard ferrule diameter of 0.0984 inches. The end of the ferrule receiving bore comprises a smooth flat wall 416 perpendicular to the transverse axis of the bore. As the ferrule is inserted into the bore, and brought into abutment with end wall 416, the wall acts as a ferrule stop, limiting the insertion of the ferrule 406 into the housing 400. A second bore, or optics cavity 408 which houses optical device 418, is formed at the opposite end of the housing. A smaller cavity 410 is formed within the optics cavity 408 and is configured to support a focusing element 412, which in the preferred embodiment comprises a spherical ball lens press fit into the lens cavity 410. Lens cavity 410 and ferrule receiving bore 402 are joined by a through bore 414 which allows focused optical radiation to pass from the ball lens 412 to the optical waveguide 404 contained within the alignment ferrule 406. The portion of the ferrule receiving bore 402 immediately adjacent ferrule stop 416 is precision molded such that with the alignment ferrule 404 fully inserted into the ferrule receiving bore 402 and in direct physical abutment against the ferrule stop 416, the optical waveguide 404 contained within the alignment ferrule 406 will be centered directly over the through bore 414. Ball lens 412 is configured to focus the light emitted from optical device 418 mounted at the base of housing 400 to a point at the opposite end of through bore 414 corresponding to the end of optical waveguide 404, thereby coupling the optical radiation into the waveguide.

The base of housing 400 forms an annular mounting surface 420. A substrate member 422 is provided for mounting the optical device 418 thereon. The optical device 418 may be a TO-46 can, or some other style optical device, either packaged or unpackaged. A number of mounting posts 424, formed integrally with housing 400, extend from the base of the housing perpendicular to mounting surface 420. Corresponding alignment holes 426 are formed in substrate member 422. The posts 424 and holes 426 are located such that when the housing is mounted to the substrate member 420, the posts extend through the mounting holes, allowing the planar surface defined by annular mounting surface 420 to rest flush against the flat surface of substrate member 422. As can be best seen in FIG. 6B, alignment holes 426 are formed having a larger diameter than mounting posts 424.

This allows substrate member 422 to be maneuvered relative to housing 400 to facilitate alignment of the optical device 418 with the optical elements mounted within the housing 400. The optical device 418 is rigidly fixed to substrate member 422, and is aligned with the optical elements within housing 400 by moving the substrate relative to the housing. The optical elements are actively aligned as previously discussed in order to determine the optimum relative position between the substrate member and housing 400 where the maximum amount of optical radiation emitted from the optical device 418 is coupled into the optical waveguide 404.

Upon finding the optimum relative position between the housing 400 and substrate member 422, it is necessary to secure the two pieces together to maintain that relationship. The present invention contemplates a number of methods for bonding the housing 400 to the substrate member 422 while simultaneously maintaining the proper alignment between the various optical components. A first method involves reflowing the plastic posts to fill the alignment holes and forming a meniscus over the holes that extends over a portion of the substrate member (see FIG. 6B). Using this method various non-contact means of melting the posts can be employed, including a $CO_2$ laser, an infrared heat source or hot air, among others. A similar method involves partially reflowing the post using the methods described, and using a rivet forming tool to compress the semi-molten plastic at the proper temperature. The rivet forming tool helps to shape the meniscus and control the flow of molten plastic to provide cleaner final result. The results of this process are shown in FIG. 6C. As can be seen, the mounting posts 424 completely fill the alignment holes 426 so that the substrate member 422 cannot be moved in the X-Y direction relative to the housing 400. The menisci spread over portions of the substrate member 422 preventing the housing and substrate member from being separated.

Another method contemplated involves an additive bonding process where a hot melt adhesive such as melted LCP is poured into the gaps between the alignment holes 426 and the mounting posts 424 (see FIG. 6B). Yet another method which can be used to bond the substrate member 422 to the housing 400 is to form the substrate member out of a molded plastic, and laser weld the housing directly to the substrate. In any case, the bonding process secures the housing 400 to the substrate, permanently fixing the alignment of all of the optical components mounted therein.

An additional embodiment of the invention is shown in FIG. 7. A plastic housing 500 is shown which is identical to the plastic housing 400 of the previous embodiment except that there are no mounting posts formed at the base of the housing. Instead of mounting posts, an annular metal insert 524 is press fit into the second bore, or optics cavity 508 of housing 500. The outer surfaces 526 of the metal insert are formed with surface features such as a knurled pattern, threads, bumps or some other feature known to increase the frictional adherence of adjacent surfaces to secure the insert 524 within the housing. An annular flange 528 extends around one end of the metal insert perpendicular to the longitudinal axis thereof. With the metal insert 524 fully inserted into the optics cavity 508, the flange 528 engages the annular mounting surface or base 520 of housing 500. In the present embodiment, the outside surface 530 of the insert flange 526 acts as the mounting surface for attaching a substrate member 522. The substrate member 522 is formed having a metal edge so that the substrate member can be welded to the upper surface 530 of the annular flange 528 of metal insert 524. The substrate member itself can be formed in a number of different ways to provide a weldable metal edge. For example, the substrate member can be a typical printed circuit board having heavy copper traces or plated metal traces formed along the edges. The metallized edges allow the PC board to be welded to the metal flange 528 using a fillet type weld. Another option is to provide a metal plate having clearance holes for allowing the electrical leads of the optical device to extend through the substrate member. Forming the substrate member of a thin metal plate allows a lap weld through the substrate member rather than a fillet weld around the edges. Yet another option is to form the substrate member 522 as a metal washer, having an outer diameter corresponding to the outer diameter of the insert flange. In this configuration, the optical device is mounted to one side of the washer, with the electrical leads extending through the aperture in the center of the washer.

However substrate member 522 is configured, an optical device such as a TO 46 can is affixed thereto. The resultant subassembly can be actively aligned to the housing 500, and welded to the outer surface 530 of the annular insert flange 528, thereby securing the proper optical alignment of the optical device to the optical axis of the housing 500. As an alternative to welding, the metallized edges of the substrate can also be soldered to the annular flange 528.

Figure 7A:
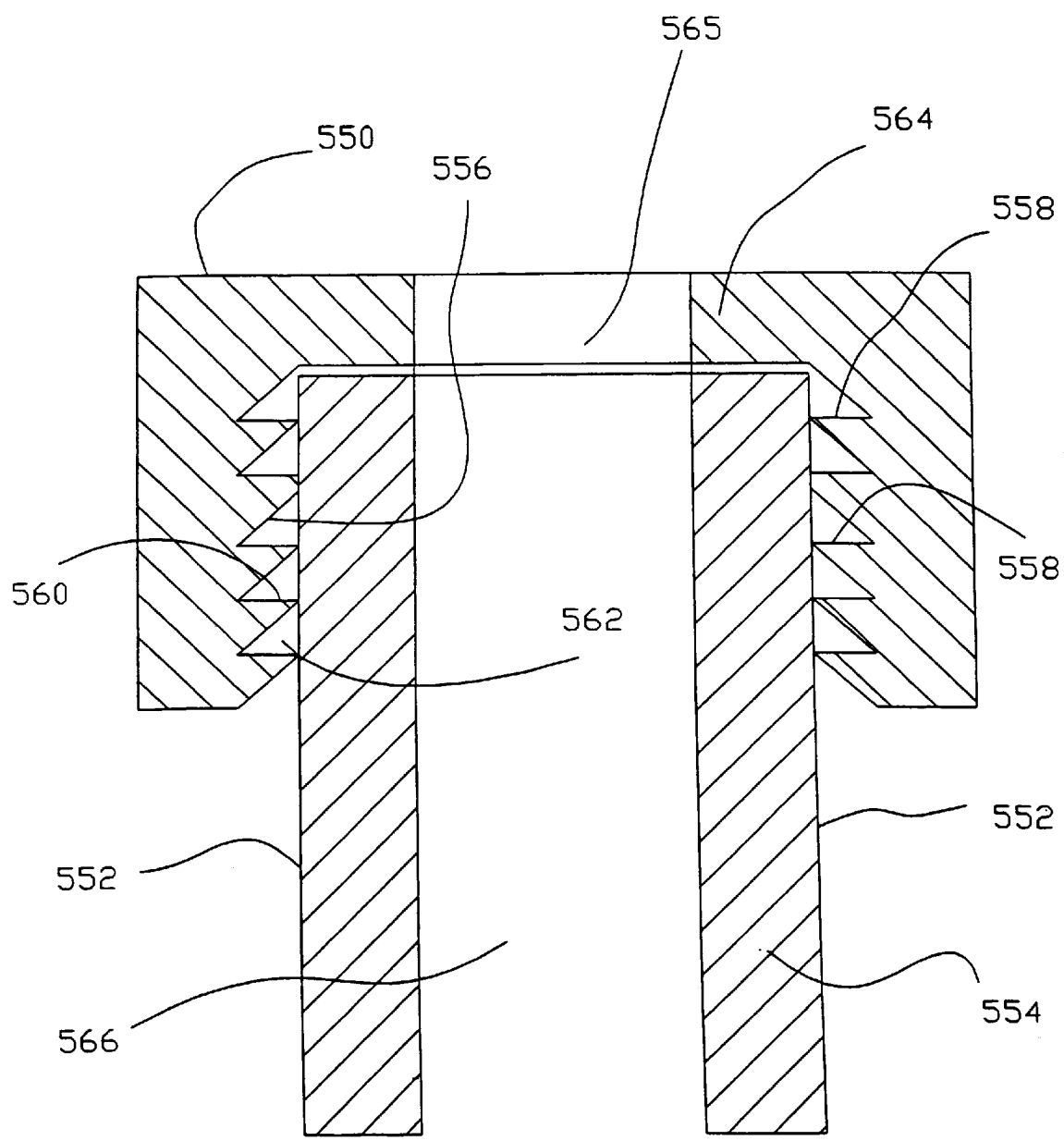
FIG. 7A is a side elevation cross section of the embodiment of FIG. 7, however with a metal cap engaging the outer surface of the housing, and having barbed metal teeth forming the interference fit with the housing.

In an alternative arrangement, the metal insert of FIG. 7 may be replaced by a metal cap 550 as shown in FIG. 7A. In this embodiment, the cylindrical cap slides over the outer surface 552 of the housing 554. Again, surface features, such as a knurled finish, threads, barbed teeth, or some other pattern are formed on the inner mating surface of the cap 556. In the preferred embodiment shown in FIG. 7A, the surface features comprise a plurality of barbed teeth 558. The individual teeth 558 may take on a variety of shapes, however, for the purpose of the present invention, it has been determined that the shape shown in FIG. 7A is most effective for retaining the metal cap 550 to the end of the plastic housing 554. As shown in the drawing, the teeth are triangular in shape, forming a saw-tooth pattern along the inner surface of the metal cap 554. Each tooth includes a normal surface 560 extending perpendicular to the mating surface 552 of the plastic housing 554, and an angled surface 562 extending from the end of the tooth to the base of the adjacent tooth. Test data has shown that such an arrangement provides a gripping force in excess of 25 lbs. resisting the removal of the cap 550 from the housing 554. Furthermore, the angled surfaces 562 between individual teeth allow the cap to be more easily inserted over the housing.

The metal cap 550 includes an end plate 564 having an aperture 565 formed therein, corresponding to the optics cavity 566 formed in the plastic optics housing 554. The endplate serves the same function as the annular flange 528 of the embodiment shown in FIG. 7. The outer surface of the endplate acts as the mounting surface for attaching a substrate member 568 on which an optoelectronic device is attached to the housing 554.

All of the methods for attaching the substrate member to the metal insert described in FIG. 7 are applicable to mounting substrate member 568 to the end cap 554 of the present embodiment. Therefore, the optoelectronic device mounted on substrate member 568 may be actively aligned with the housing and the substrate member welded in place to secure the final alignment of the optoelectornic device.

Figure 8B:
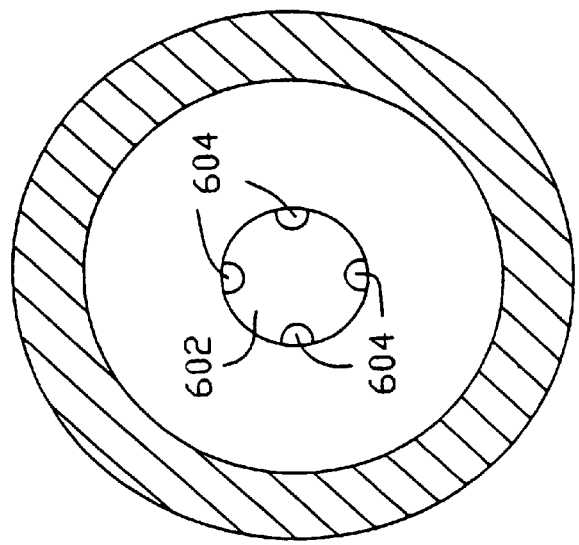
FIG. 8B is an end view of the plastic optics package of FIG. 8A showing retaining features extending into the lens cavity.
Figure 8A:
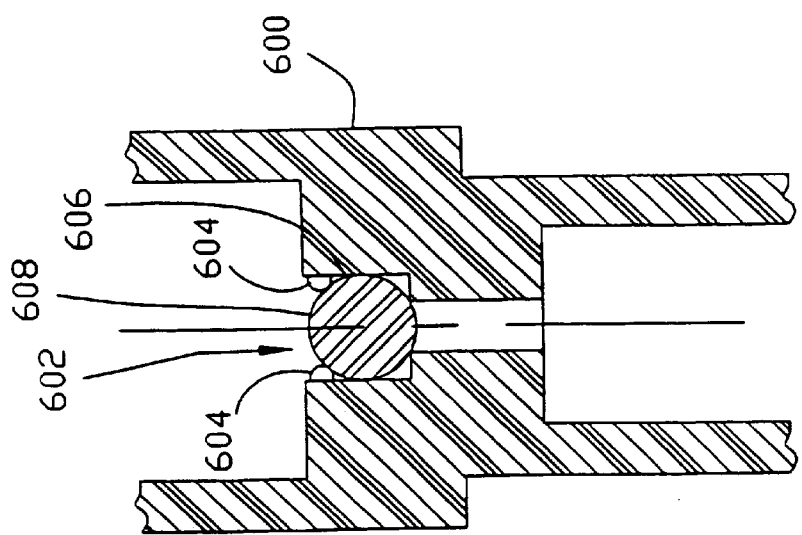
FIG. 8A is a cross section of a plastic optics package showing a ball lens captured within a lens cavity with retaining features, the lens cavity opening into the optics cavity.

The plastic housing of the previous embodiments allows improvements to be made to the optical package which are unavailable when the housing is formed of metal. One such improvement involves mounting the focusing element within the plastic housing. As can be seen in FIGS. 1, 2, and 3, in the previous embodiments, special provisions must be made for mounting a spherical ball lens within the housing. However, if the housing is formed of a compliant plastic material as disclosed in the embodiments depicted in FIGS. 6 and 7, retaining features can be formed in the lens cavity to hold a ball lens in place. FIG. 8A shows a cross section of a portion of an optical housing 600 including a lens cavity 602 having such a retaining feature. In this embodiment the retaining feature comprises protrusions 604 which extend from the cavity wall 606 into the cavity itself. As seen in the plan view of the lens cavity in FIG. 8B, the protrusions 604 are arrayed around the entrance to the lens cavity 602 forming a restriction therein. The protrusions 604 are sized such that a ball lens 608 can be press fit into the cavity 602. As the ball lens 608 is being pressed into the cavity 602, the compliant protrusions 604 yield to the force applied by the ball lens 608, compressing sufficiently to allow the ball lens 608 to enter the cavity 602. After the ball lens passes the restriction at the entrance to the cavity, the protrusions decompress to their normal expanse, capturing the ball lens 608 within the cavity 602. While the protrusions 604 shown in FIG. 8 are hemispherical in shape, it should be clear to those skilled in the art that any shaped protrusion restricting the entrance to the lens cavity will suffice to retain the ball lens 608.

Figure 8C:
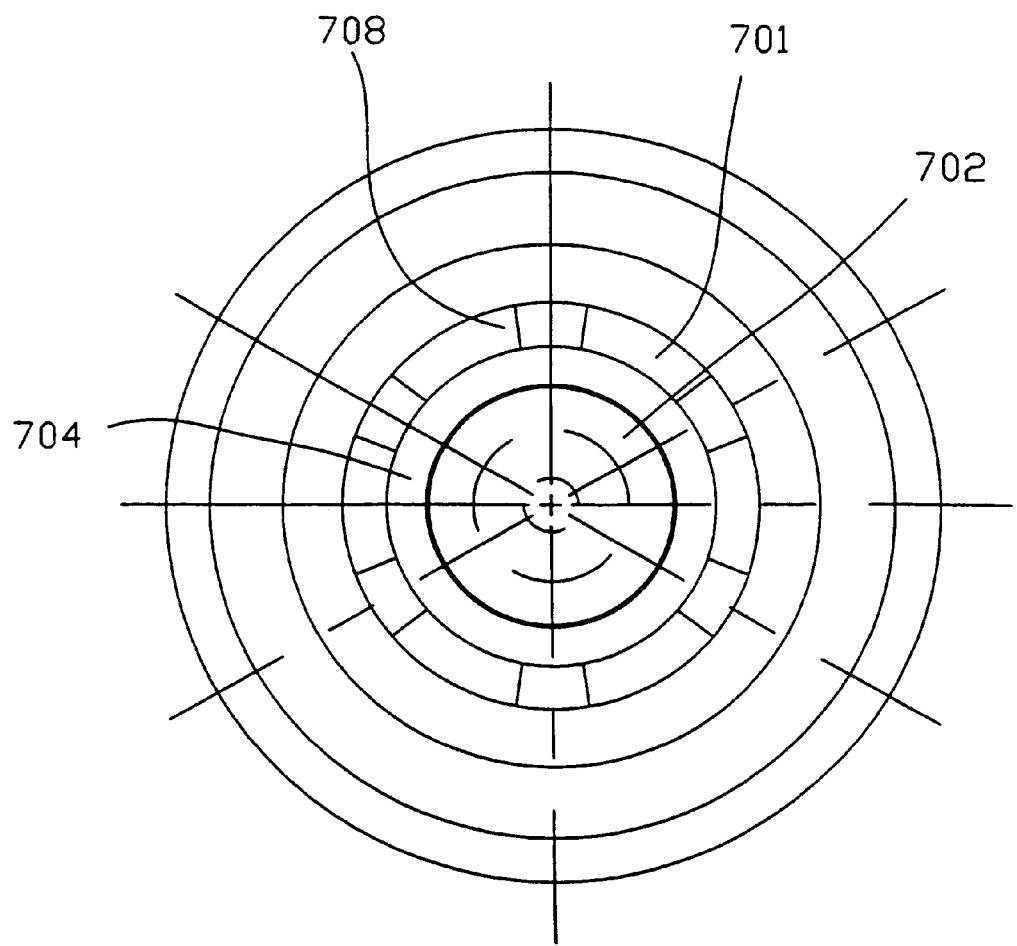
FIG. 8C is an end view of a plastic optics housing incorporating an alternate lens retaining feature.
Figure 8D:
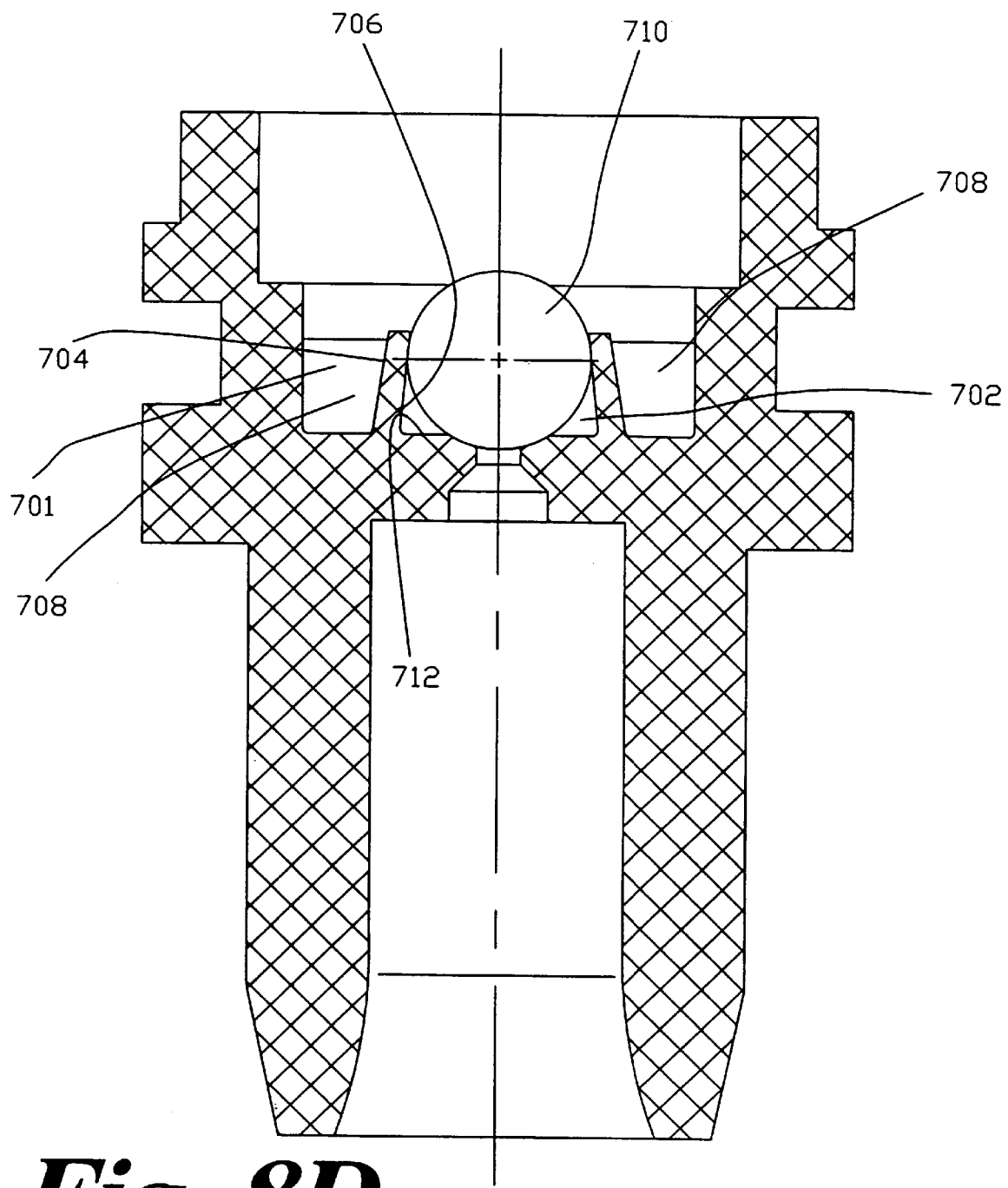
FIG. 8D is a cross section of the plastic optics housing of FIG. 8C.

Referring now to FIGS. 8C and 8D, an alternate embodiment of a lens retention mechanism is shown. In this embodiment, the lens cavity 702 is formed in the midst of a larger depression 701. The lens cavity is defined by a slightly angled perimeter wall 704 surrounding the cavity. An inner surface 706 of the perimeter wall is pitched such that the lens cavity is wider at the base of the perimeter wall that it is near the opening to the cavity. The perimeter wall is surrounded by a plurality of plastic buttresses 708 which add rigidity and strengthen the perimeter wall.

As noted, the diameter at the entrance to the lens cavity is narrower than the diameter at the base. The diameter of the ball lens 710 to be inserted into the cavity, is greater than the entrance diameter of the cavity. Thus, the perimeter wall 704 must expand outward as the ball lens 710 is pressed into the lens cavity. This outward expansion of the perimeter wall may cause the wall to crack in one or more places. However, this is of no consequence since the buttresses 708 surrounding the perimeter wall will retain any separated section of the perimeter wall in place after the ball lens has been fully inserted into the lens cavity. Once fully inserted into the lens cavity, the ball lens will rest against the base of the cavity 712, and the pitched inner surface of the perimeter wall will tangentially engage the upper hemisphere surface of the ball lens, thereby retaining the lens within the cavity.

Figure 9:
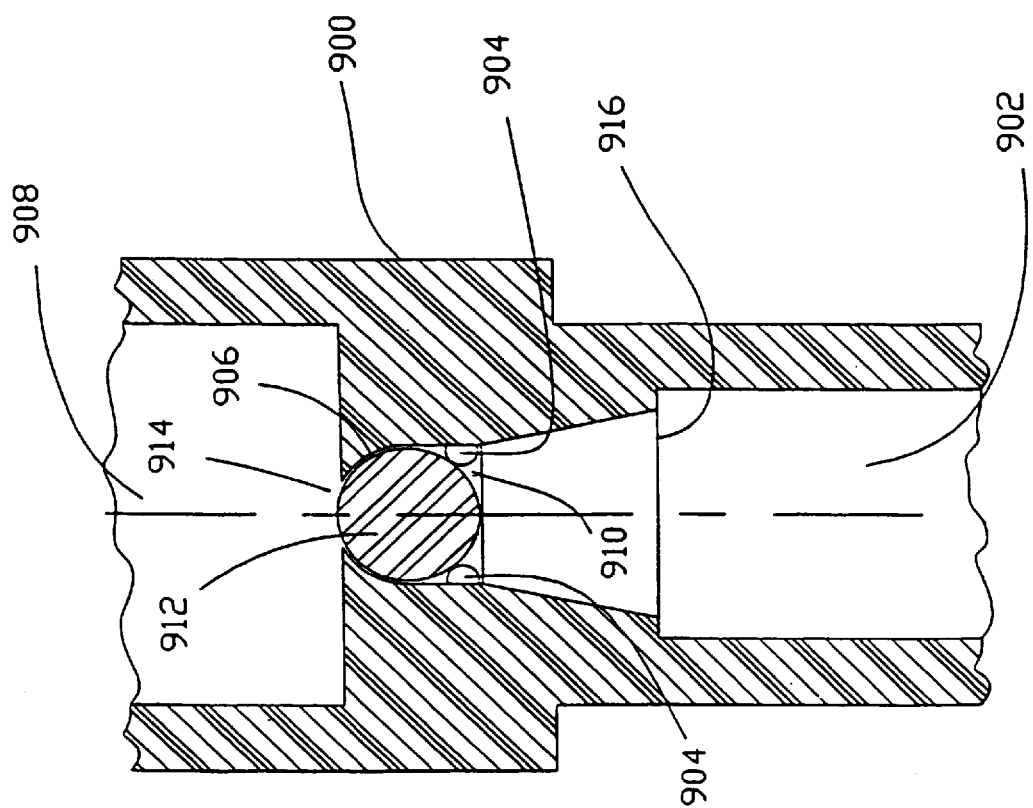
FIG. 9 is a cross section of a plastic optics package showing a ball lens captured within a lens cavity with retaining features, the lens cavity opening into the ferrule receiving bore.

Another embodiment for mounting a ball lens within a plastic optics housing is depicted in FIG. 9. This embodiment includes a plastic housing member 900, similar to that disclosed with regard to FIGS. 6, and 7. The housing includes a first bore 902 for receiving a connector ferrule, an optics cavity 908, and a lens cavity 910 disposed therebetween. However, rather than being formed adjacent the optics cavity as in the previous embodiment, the lens cavity of the present embodiment is formed adjacent the ferrule receiving bore 902. A ferrule stop 916 is formed of an annular shoulder at the end of the first bore 902. From the inner diameter of the ferrule stop, the bore tapers toward the lens cavity 910. The lens cavity 910 is cylindrical, having approximately the same diameter as a ball lens. The end of the lens cavity 910 is adjacent the optics cavity 908, with a small aperture 914 communicating therebetween. An end surface 906 of the lens cavity is rounded, conforming to the shape of the ball lens 912 to be inserted therein. Retaining features 904 protrude around the entrance to the lens cavity in a similar fashion to that discussed with regard to FIG. 8. Again, the retaining features 904, while shown here as hemispherical protrusions, can take on any shape desired so long as they exert sufficient pressure against the ball lens 912 to retain the ball lens within the lens cavity 910. With this arrangement, the ball lens 912 may be inserted into the housing 900 through the ferrule receiving bore. A predetermined amount of insertion force is required to compress the retaining features, and once the ball lens 912 is past, the retaining features 904 expand around the entrance to the lens cavity 910 to hold the ball lens 912 in place. Within the lens cavity 910, the ball lens is seated against the rounded end surface 906 of the cavity. A small portion of the round surface of the ball lens protrudes through the aperture 914 between the lens cavity 910 and the optics cavity 908, extending into the lens cavity 908.

The primary advantage of the configuration depicted in FIG. 9 is that during the molding process for forming the housing 900, a single core pin can be used to form the ferrule receiving bore 902 and the lens cavity 910. This ensures precise alignment of these two chambers. Thus, when precision molding techniques are used to form housing 900, and a ball lens is inserted into the lens cavity 910 and a connector ferrule is inserted into the bore 902, the optical fiber within the ferrule will be precisely aligned with the focal axis of the ball lens. Therefore, the only alignment variable will be the location of the optical device at the opposite end of the optics cavity.

Figure 10:
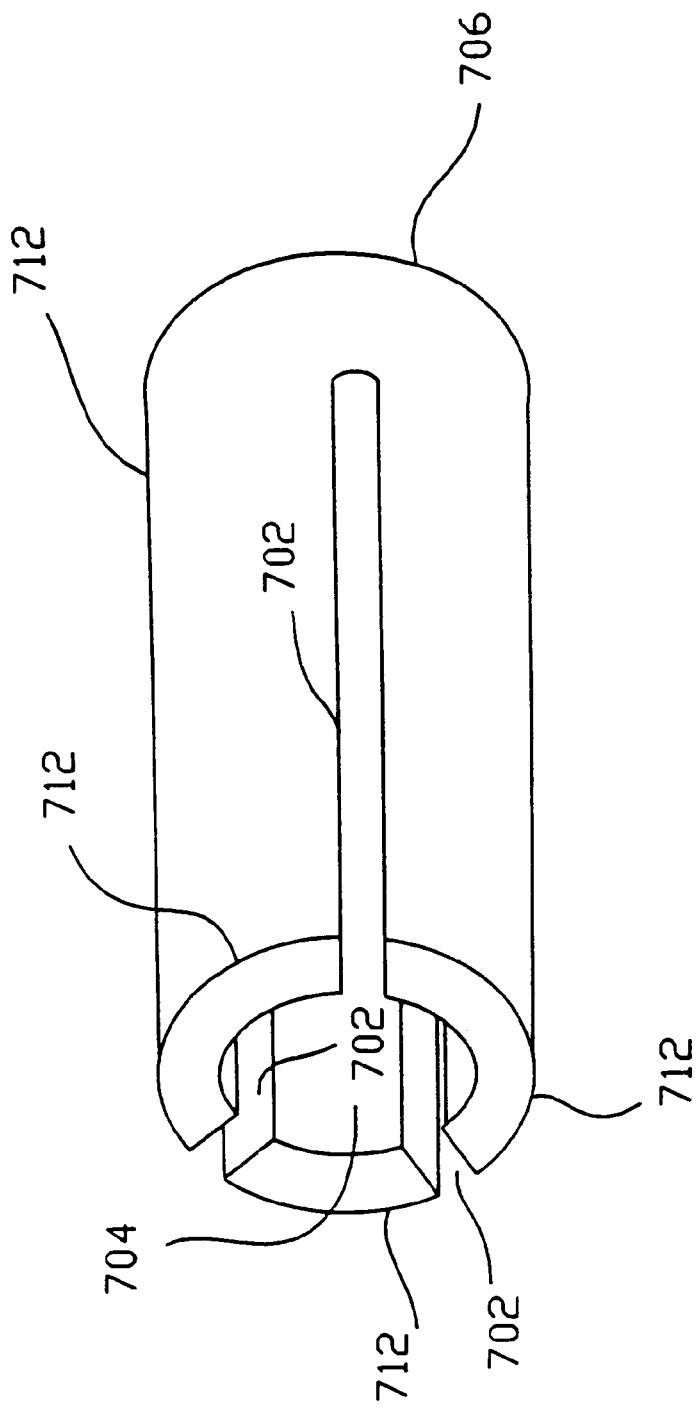
FIG. 10 shows a split bore feature formed in an optical waveguide receiving bore.

An additional advantage to the plastic housings embodied in FIG. 6 and 7 is that a split bore configuration can be incorporated with the ferrule receiving bore. A portion of plastic housing 700 employing such a feature is shown in FIG. 10. As shown, the split bore embodiment contemplates narrow slots 702 formed in the ferrule receiving bore 704. The slots 702 extend from the receiving end of the bore 704 toward the base 706 of the bore near where a focusing element is mounted. The slots 702 allow the walls 712 of the housing to flex as a ferrule is inserted into the bore. Precision alignment of the ferrule is only necessary at the base end 706 of the bore adjacent the focusing element. The flexibility of the bore sidewalls 712 diminishes toward the end of the slots, thus as a ferrule 710 is inserted into the bore, the increasing rigidity of the sidewalls 712 gradually forces the ferrule toward the precision alignment position at the base 706 of the bore. This arrangement has the advantages of simplifying the mating procedure of the ferrule housing, and reduces the area of precision molding necessary to properly align an optical waveguide within the housing, thereby reducing the cost of molding the plastic housing.

Figure 10A:
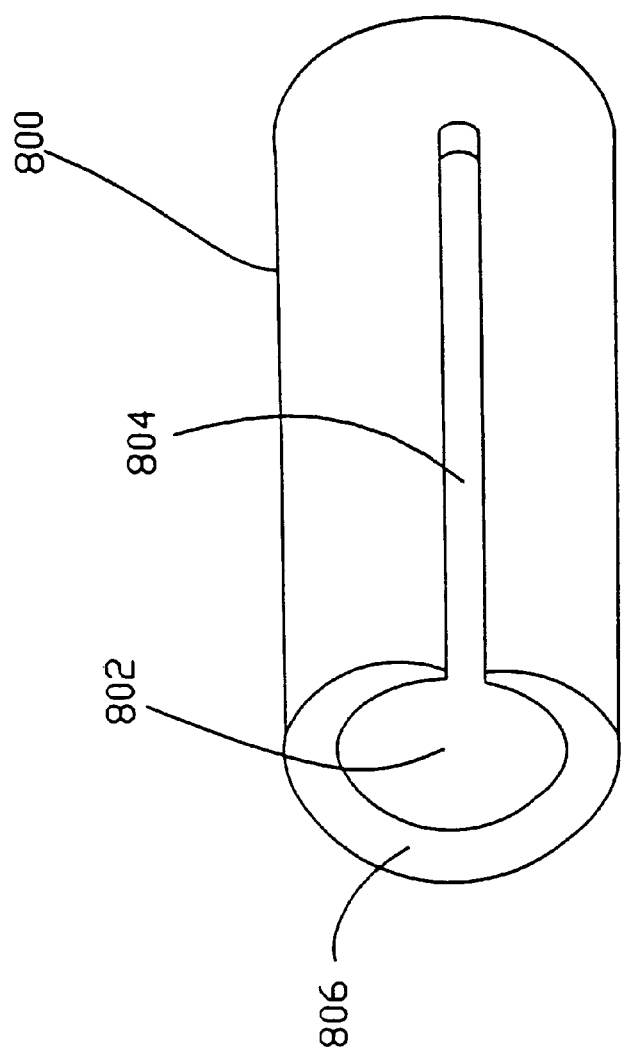
FIG. 10A shows a second embodiment of a split bore feature.

An alternate split bore configuration is shown in FIG. 10A. In this embodiment, the portion of the housing 800 which defines the bore 802 contains only a single longitudinal slot 804. The outer wall of the housing member forming the ferrule receiving bore is asymmetrical around the bore. Looking at the end of the bore, it can be seen that the outer wall 806 of the housing is thickest a point opposite the single longitudinal slot, then gradually tapers in each angular direction toward the slot 804. The asymmetrical nature of the housing wall 806 provides a uniform centering force against a connector ferrule inserted therein. The centering force applied against the connector ferrule helps to align the optical fiber within the ferrule with the optical axis of the housing.

It should be understood that various changes and modifications to the presently preferred embodiments described herein will be apparent to those skilled in the art. Such changes and modifications may be made without departing from the spirit and scope of the present invention and without diminishing its attendant advantages. For example, the present invention may be manufactured as a pair of optical devices or an array of any desired number of such components. It is, therefore, intended that such changes and modifications be covered by the appended claims.

What is claimed is:

1. An optical package comprising:
   a housing having a first end and a second end, a ferrule receiving bore being formed in the first end, and an optics cavity formed in the second end, axially aligned with the ferrule receiving bore;
   a mounting cap inserted over the optics cavity and frictionally engaging an outer surface of the housing, the mounting cap including an endplate; and
   a substrate having an optical device mounted thereon, attached to the endplate.

2. The optical package of claim 1 further comprising:
   friction enhancing means formed on an inner surface of the mounting cap for strengthening the frictional engagement of the mounting cap to the outer surface of the housing.

3. The optical package of claim 2 wherein the friction enhancing means comprises a knurled finish formed on an inner surface of the mounting cap.

4. The optical package of claim 2 wherein the friction enhancing means comprises internal threads formed on an inner surface of the mounting cap.

5. The optical package of claim 2 wherein the friction enhancing means comprises a plurality of barbed teeth formed on an inner surface of the mounting cap.

6. The optical package of claim 5 wherein the mounting cap comprises a metal cylinder having an annular side wall, and said barbed teeth being formed on an inner surface thereof.

7. The optical package of claim 6 wherein the barbed teeth comprise a first tooth surface generally perpendicular to a longitudinal axis of the cylindrical mounting cap, and a second intersecting tooth surface formed at an acute angle to the first tooth surface.

8. The optical package of claim 7 wherein the housing further comprises a lens cavity associated with the optics cavity configured to receive a spherical focusing element having a lens diameter, the lens cavity defining an entrance diameter, the lens diameter being greater than the entrance diameter.

9. The optical package of claim 8 wherein the lens cavity further defines a base diameter, the base diameter being greater than the entrance diameter.

10. The optical package of claim 8 further comprising an outer perimeter wall surrounding the lens cavity, the perimeter wall having an inclined inner surface.

11. The optical package of claim 10 further comprising a plurality of plastic buttresses disposed around an outer circumference of the perimeter wall.

12. The optical package of claim 1 wherein the mounting cap is formed of metal.

13. The optical package of claim 1 wherein the mounting cap is formed of a polymer material.

14. A plastic optical package comprising:
   a first end defining a bore for receiving an optical waveguide;
   a second end defining an optics cavity configured to receive an electro-optical device; and a lens cavity associated with the optics cavity, configured to receive a spherical focusing element having a lens diameter, the lens cavity defining an entrance diameter, the lens diameter being greater than the entrance diameter.

15. The plastic optical housing of claim 14 further comprising an outer perimeter wall surrounding the lens cavity, the perimeter wall having an inclined inner surface.

16. The plastic optical housing of claim 15 further comprising a plurality of plastic buttresses disposed around an outer circumference of the perimeter wall.

17. The plastic optical package of claim 14 wherein the lens cavity further defines a base diameter, the base diameter being greater than the entrance diameter.

18. The plastic optical package of claim 14 further comprising a mounting cap configured to enclose the optics cavity and having a mounting surface for attaching a substrate thereto, and an aperture communicating with the optics cavity to receive the electro-optical device which is mounted to the substrate.

19. A ball lens retention mechanism for mounting a spherical ball lens within a plastic optics housing, the retention mechanism comprising:
   a base formed on an inner surface of an optics cavity formed in an end of the housing;
   an annular wall arising from the base, the wall defining a lens cavity and further comprising;
   an inclined inner surface of the annular wall such that the annular wall defines a first diameter within the lens cavity and a second diameter at a distal end of the wall, the first diameter being greater than the second diameter.

20. The ball lens retention mechanism of claim 19 further comprising a plurality of support buttresses disposed around an outer perimeter of the wall.

21. The ball lens retention mechanism of claim 20 wherein the ball lens defines a diameter greater than the second diameter and less than the first diameter.

* * * * *